United States Patent
Lim et al.

(10) Patent No.: US 10,168,387 B2
(45) Date of Patent: Jan. 1, 2019

(54) INTEGRATED DEFECT DETECTION AND LOCATION SYSTEMS AND METHODS IN SEMICONDUCTOR CHIP DEVICES

(75) Inventors: Cheow Guan Lim, Singapore (SG); Giovanni Ferrara, Singapore (SG)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 13/541,063

(22) Filed: Jul. 3, 2012

(65) Prior Publication Data
US 2014/0013171 A1    Jan. 9, 2014

(51) Int. Cl.
*G01R 31/3177* (2006.01)
*G01R 31/3187* (2006.01)
*G01R 31/3185* (2006.01)
*G01R 31/319* (2006.01)

(52) U.S. Cl.
CPC ........ *G01R 31/3187* (2013.01); *G01R 31/319* (2013.01); *G01R 31/31903* (2013.01); *G01R 31/31915* (2013.01); *G01R 31/318533* (2013.01); *G01R 31/318558* (2013.01); *G01R 31/318561* (2013.01); *G01R 31/318563* (2013.01); *G01R 31/318566* (2013.01)

(58) Field of Classification Search
CPC .............. G01R 31/3187; G01R 31/319; G01R 31/31903; G01R 31/31915; G01R 31/318533; G01R 31/318558; G01R 31/318561; G01R 31/318563; G01R 31/318566
USPC ........ 714/773, 724, 726, 733, 734, E11.145, 714/E11.146, E11.155; 324/512, 527, 324/528, 537, 750.3
See application file for complete search history.

(56) References Cited

U.S. PATENT DOCUMENTS

| 4,847,800 | A | 7/1989 | Daane |
| 5,723,875 | A * | 3/1998 | Abe et al. ............. 257/48 |
| 6,649,986 | B1 | 11/2003 | Ishizaki |

(Continued)

FOREIGN PATENT DOCUMENTS

| CN | 1404122 A | 3/2003 |
| WO | WO-2008-093312 A1 | 8/2008 |
| WO | WO 2008093312 A1 * | 8/2008 |

OTHER PUBLICATIONS

Office Action dated Sep. 21, 2015 for Chinese Patent Application No. 201310276525.3.

*Primary Examiner* — Christian M Dorman
(74) *Attorney, Agent, or Firm* — Schiff Hardin LLP

(57) ABSTRACT

Embodiments relate to systems and methods for defect detection and localization in semiconductor chips. In an embodiment, a plurality of registers is arranged in a semiconductor chip. The particular number of registers can vary according to a desired level of localization, and the plurality of registers are geometrically distributed such that defect detection and localization over the entire chip area or a desired chip area, such as a central active region, is achieved in embodiments. In operation, a defect detection and localization routine can be run in parallel with other normal chip functions during a power-up or other phase. In embodiments, the registers can be multi-functional in that they can be used for other operational functions of the chip when not used for defect detection and localization, and vice-versa. Embodiments thereby provide fast, localized defect detection.

22 Claims, 14 Drawing Sheets

(56) References Cited

U.S. PATENT DOCUMENTS

| | | | |
|---|---|---|---|
| 7,700,944 B2* | 4/2010 | Nishizawa | 257/48 |
| 7,948,249 B2* | 5/2011 | Park | 324/719 |
| 2004/0195672 A1* | 10/2004 | Takeoka et al. | 257/700 |
| 2008/0012572 A1* | 1/2008 | Tsukuda | 324/522 |
| 2010/0293424 A1* | 11/2010 | Katagi et al. | 714/728 |
| 2011/0113286 A1* | 5/2011 | Takasuka et al. | 714/30 |
| 2011/0258501 A1* | 10/2011 | Touba et al. | 714/726 |
| 2012/0262197 A1* | 10/2012 | Bernstein | H01L 21/6835 324/750.3 |

\* cited by examiner

INTEGRATED DEFECT DETECTION AND LOCATION SYSTEMS AND METHODS IN SEMICONDUCTOR CHIP DEVICES

TECHNICAL FIELD

The invention relates generally to defect detection and more particularly to integrated defect detection systems and methods for identifying and locating cracks, chips and other physical defects in semiconductor chip devices.

BACKGROUND

In semiconductor chip manufacturing, a high number of individual semiconductor chip devices are formed on a single semiconductor wafer. At a later stage of manufacturing, the individual devices are singulated from the wafer, such as by dicing, sawing, laser cutting or some other physical separation technique. Singulation, whether by these example techniques or others, can damage some percentage of the individual semiconductor chips by causing cracks, chips or other physical damage or defects. Damage or defects also can be caused by other processing and handling or from other causes, such as cleaning or packaging. The particular locations and effects of the damage can be unpredictable. While some of this damage can be minor, some semiconductor chips will sustain damage sufficient to render them totally inoperative. Others may function initially but suffer from defects that cause them to fail either during end-of-line testing or, worse, during use of the device, shortening its lifetime.

SUMMARY

Embodiments relate to defect detection systems and methods for semiconductor devices.

In an embodiment, a semiconductor chip defect detection and localization system comprises a plurality of registers spaced apart from one another and coupled with one another by a signal line; and logic circuitry coupled to the plurality of registers and configured to determine a presence and a location of a defect in a chip based on whether the signal propagates through one or more of the plurality of registers.

In an embodiment, a method comprises causing a signal to propagate through a plurality of registers that are coupled to one another by at least one signal line and spaced apart from another in a semiconductor chip; determining a presence and a location of a defect in the semiconductor chip according to whether the signal propagates along the at least one signal line through the plurality of registers.

In an embodiment, a device comprises means for causing a signal to propagate through the plurality of registers spaced apart from one another in a semiconductor chip and coupled to one another by at least one signal line; means for determining a presence and a location of a defect in at least one portion of the semiconductor die based on whether the signal propagates through the plurality of registers.

BRIEF DESCRIPTION OF THE DRAWINGS

The invention may be more completely understood in consideration of the following detailed description of various embodiments of the invention in connection with the accompanying drawings, in which.

Figure 1:
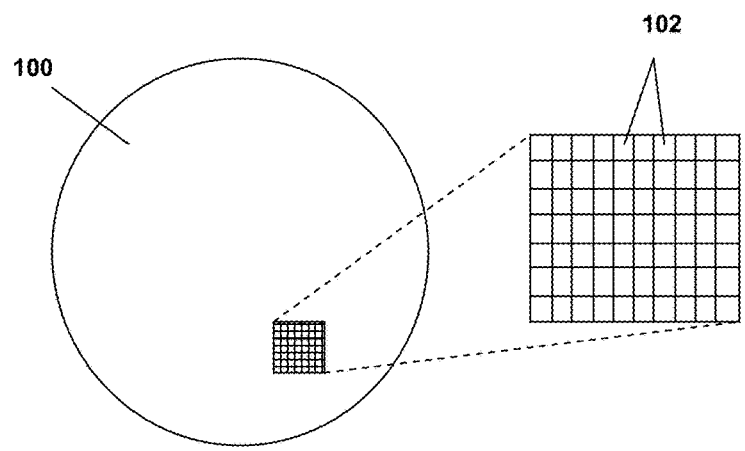
FIG. 1 is a diagram of a semiconductor wafer according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to systems and methods for defect detection and localization in semiconductor chips. In an embodiment, a plurality of registers is arranged in a semiconductor chip. The particular number of registers can vary according to a desired level of localization, and the plurality of registers are geometrically distributed such that defect detection and localization over the entire chip area or a desired chip area, such as a central active region, is achieved in embodiments. In operation, a defect detection and localization routine can be run in parallel with other normal chip functions during a power-up or other phase. In embodiments, the registers can be multi-functional in that they can be used for other operational functions of the chip when not used for defect detection and localization, and vice-versa. Embodiments thereby provide fast, localized defect detection.

Referring to FIG. 1, a semiconductor wafer 100 is depicted. Wafer 100 can be processed according to virtually any semiconductor manufacturing process, and a result is wafer 100 comprising a plurality of individual semiconductor chips 102 coupled to one another.

Figure 2:
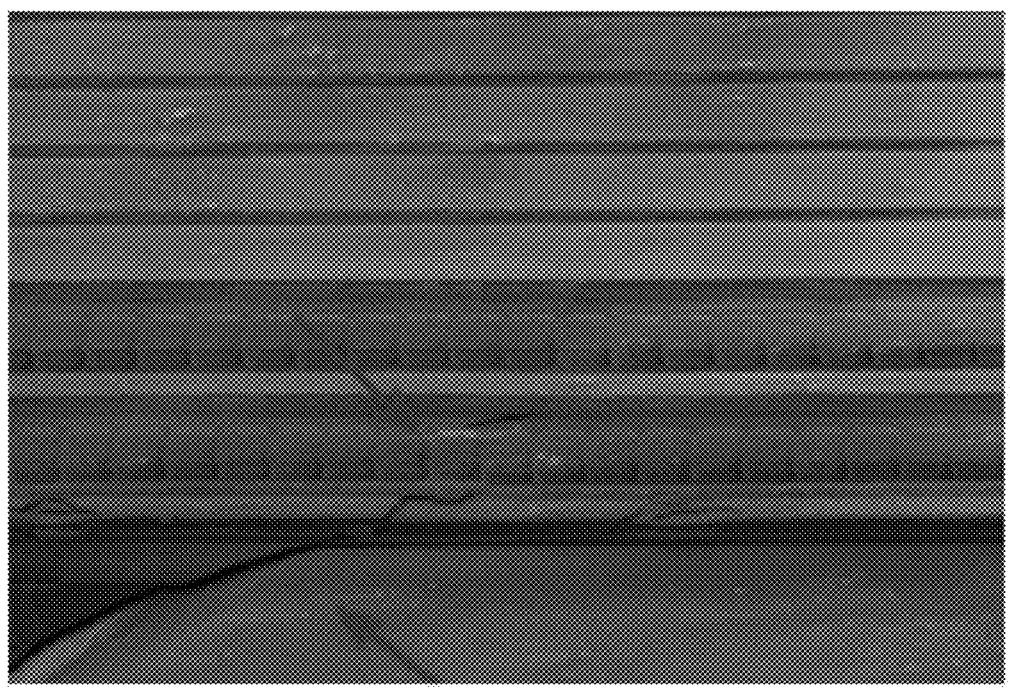
FIG. 2 is an enlarged photograph of cracks in a semiconductor chip according to an embodiment.

Once chips 102 are complete and ready for final stages of manufacturing, such as packaging, chips 102 can be singulated or diced from wafer 100. There are many different ways to dice wafer 100, including mechanical sawing, laser cutting and scribing and breaking Regardless of the methodology chosen, and despite a non-active border region being built into each chip 102 around a functional or active portion in order to accommodate defects, the dicing process can damage the active portions of individual chips 102. For example, mechanical sawing can cause tiny chips, cracks or other defects to form in the edges of individual chips 102. Refer, for example, to FIG. 2. Defects in one or more individual chips 102 can also be caused by processing, handling or causes other than dicing. For example, defects can result from general processing, fabrication, cleaning, handling, packaging or some other cause. While some defects can be benign, such as when a defect occurs close enough to the edge of chip 102 so as to not affect any functional portions of chip 102, others can be catastrophic, making some instances of chip 102 completely non-functioning or subject to a significantly reduced operational lifetime, such as if small edge-region cracks extend further into chip 102 over time because of temperature or mechanical stresses.

Figure 3A:
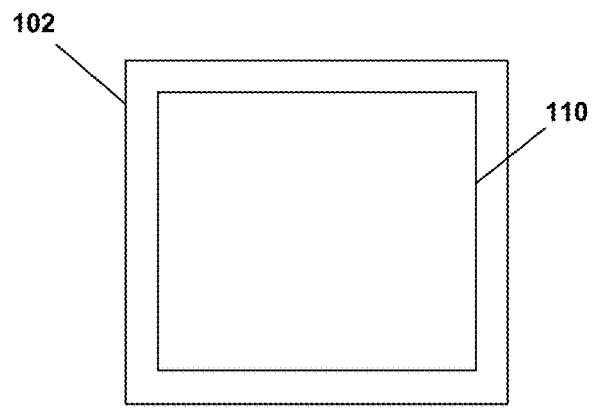
FIG. 3A is a block diagram of a semiconductor chip comprising a defect detection system according to an embodiment.
Figure 3B:
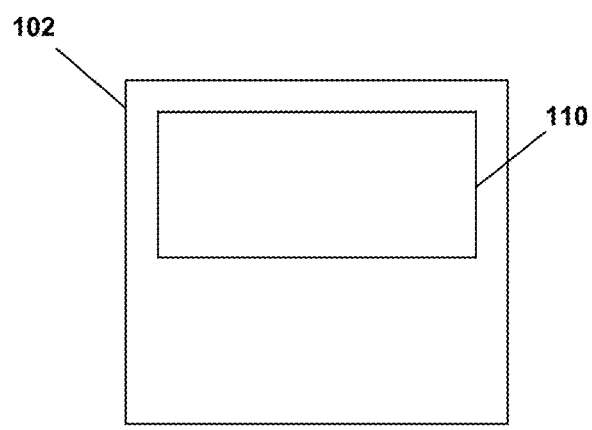
FIG. 3B is a block diagram of a semiconductor chip comprising a defect detection system according to an embodiment.
Figure 3C:
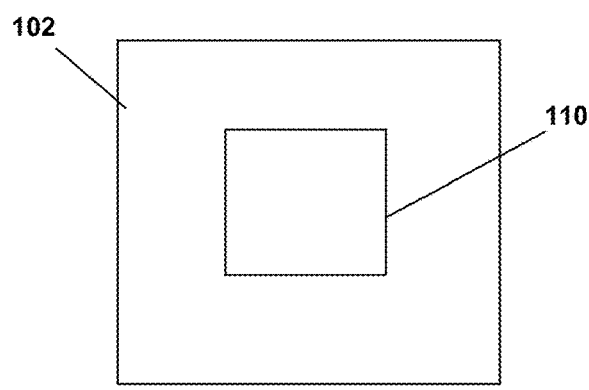
FIG. 3C is a block diagram of a semiconductor chip comprising a defect detection system according to an embodiment.

Referring to FIG. 3, which comprises FIGS. 3A, 3B and 3C, an individual chip 102 comprises a defect detection and localization system 110 ("system 110") arranged proximate an edge of chip 102. While chip 102 comprises a single system 110 in the embodiment of FIG. 3, other chips can comprise a plurality of defect detection and localization systems, as will be discussed elsewhere herein. In embodiments, system 110 can be integral to chip 102, i.e., system 110 or a portion thereof can be formed with the other functional circuitry and elements of chip 102 during wafer-stage or other processing.

In the embodiment of FIG. 3A, system 110 is arranged proximate each edge of chip 102, while in other embodiments at least a portion of system 110 can be arranged near fewer than all edges of chip 102 (see, e.g., FIG. 3B) or proximate a particular portion of chip 102, such as a central functional area (see, e.g., FIG. 3C). Moreover, while system 110 is depicted comprising straight lines in FIG. 3, in other embodiments system 110 can comprise meanders, intermediate corners, curves and other nonsymmetrical and/or non-linear shapes.

Figure 4A:
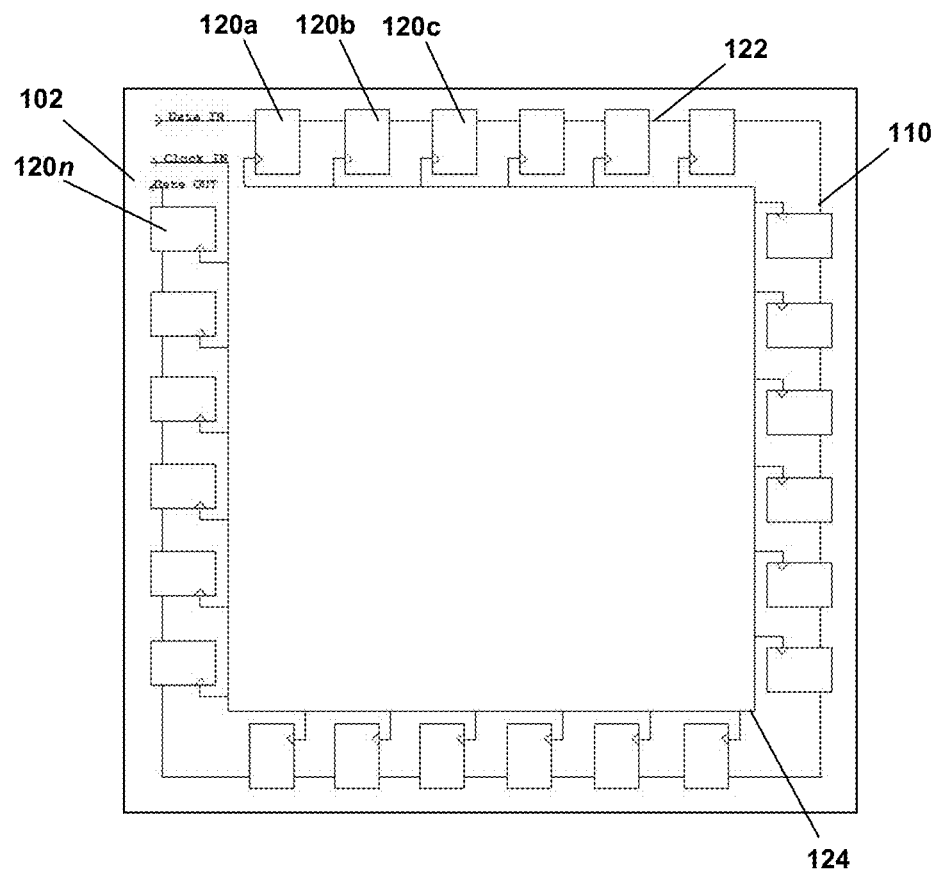
FIG. 4A is a block diagram of a semiconductor chip comprising a defect detection system according to an embodiment.
Figure 4B:
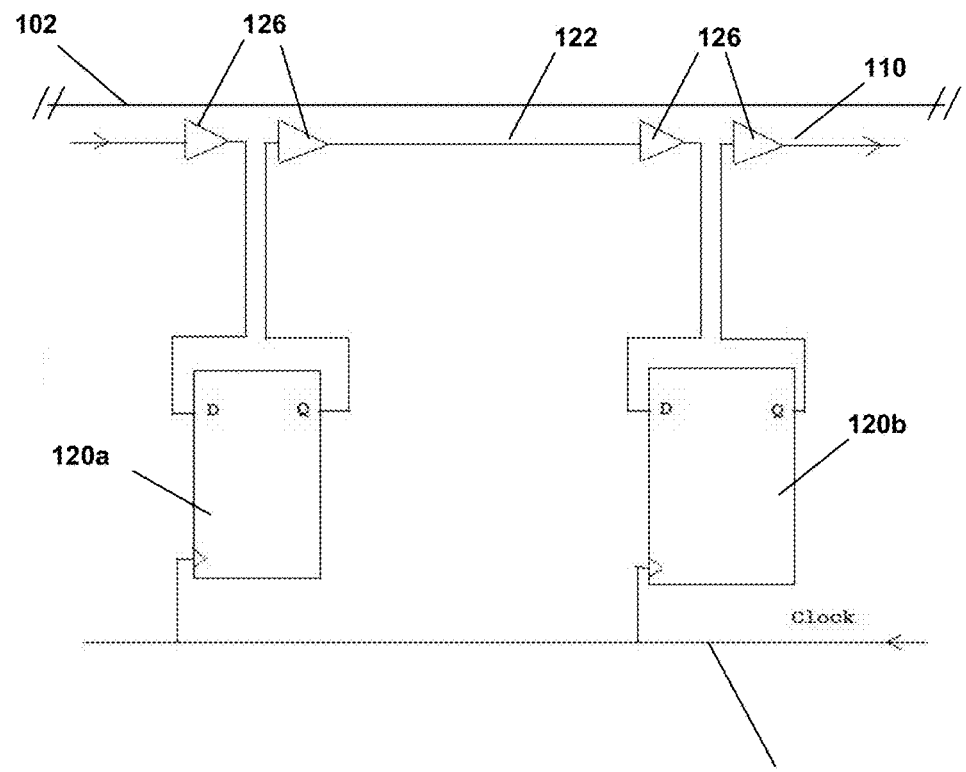
FIG. 4B is a block diagram of part of a semiconductor chip defect detection system according to an embodiment.
Figure 4C:
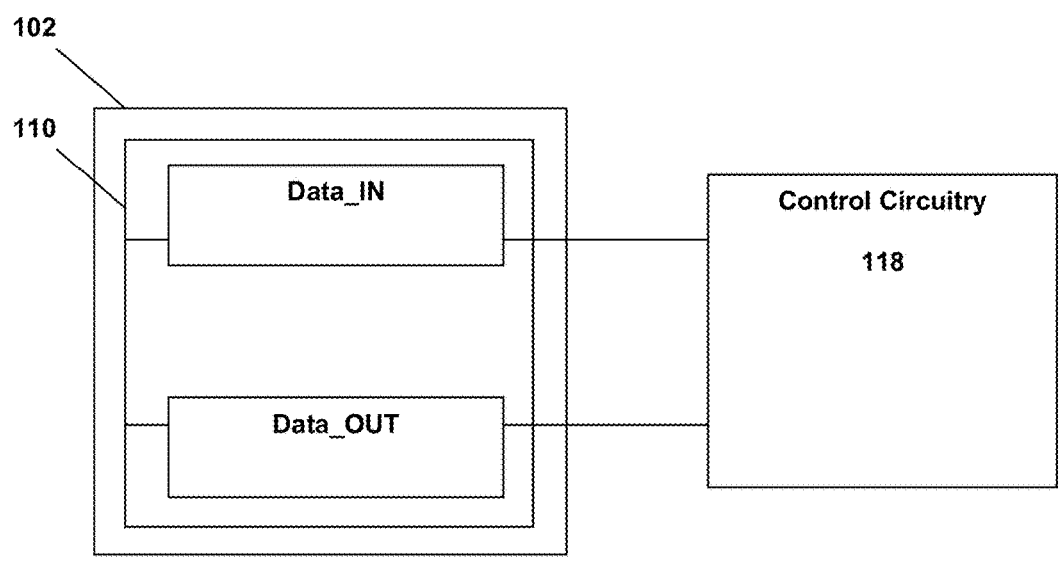
FIG. 4C is a block diagram of a semiconductor chip defect detection system according to an embodiment.

Referring to FIG. 4, which comprises FIGS. 4A, 4B and 4C, defect detection and localization system 110 comprises a plurality of individual registers 120 coupled to one another by a signal line 122 and a clock signal line 124 in an embodiment. For convenience and example purposes, the plurality of registers 120 will be referred to herein in the aggregate as registers 120, with individual registers being designated as register 120a, register 120b . . . register 120n. In embodiments, the plurality of registers 120 are coupled with another to form a shift register having an input and an output, Data_IN and Data_OUT, respectively, in FIG. 4A. A shift register operates by shifting the contents of each register to the next sequential register on each clock transition, e.g., the contents of register 120a are shifted to register 120b while the contents of register 120b are shifted to register 120c, etc., through the plurality of registers 120. In embodiments, such as that of FIG. 4B, registers 120 can comprise D flip-flops or some other suitable structure.

In the embodiment of FIG. 4A, system 110 comprises twenty-four registers coupled to one another by signal lines 122 and clock signal lines 124, but this is merely one example of an embodiment, and other embodiments can comprise more or fewer registers and/or other coupling arrangements. In general, however, the particular number of registers 120 can be related to an overall size or area to be tested, such as a general size of chip 102 or a portion of chip 102 for which defect detection and/or localization is to be carried out. For example, the number of registers is at least eight or more in some embodiments. In general, however, more registers 120 provide more precise defect detection and localization.

Other embodiments also can comprise more or fewer signal lines 122 and/or clock signal lines 124 coupling registers 120 with one another. In embodiments, at least one of signal lines 122 and clock signal lines 124 comprise wires, traces or some other suitable structure configured to enable an electrical signal to pass from a first point to a second point, such as from register 120a to register 120b and so forth.

In general, signal line 122 couples the data-out pin of each register 120 with the data-in pin of the next sequential register 120. In an embodiment, signal line 122 is implemented in one of the lowest layers of whichever technology is used for chip 102, e.g., polysilicon or Metal 1 (refer, e.g., to FIG. 5), such that signal line 122 is positioned as closely as possible to an edge of chip 102 and therefore to the sawing or separation line on wafer 100. So positioned between each register 120, signal line 122 can be the first structure to be damaged or broken due to a defect on an edge of chip 102, as discussed elsewhere herein. Clock signal line 124 can be implemented in any layer in embodiments, and generally will be routed internally as depicted in FIG. 4 in order to be relatively more protected from defects and other damage.

Referring again to FIG. 4B, defect detection system 110 can comprise buffers 126 in embodiments. Buffers 126 can be incorporated in signal line 122 between adjacent registers 120 to boost the signal on longer portions of signal line 122. The use of buffers 126 can enable registers 120 to be placed further within chip 102 and away from the edge, while signal line 122 remains close to the edge to be the first component affected by edge-type defects in embodiments.

In other embodiments, signal line 122, clock signal line 124 and some or all of the plurality of registers 120 can be positioned in alternate ways. For example, edge-type defects can be of particular interest for detection in some embodiments, whereas in others another type of defect can be of more interest for detection. Therefore, embodiments related to edge-type defect detection, with system 100 positioned therefor, are not be construed as limiting but merely as exemplary of an embodiment. The principles and factors related to such an embodiment can be extrapolated and applied to others. For example, signal line 122 can be positioned in or proximate an area of chip 102 for which defect detection is to be carried out, and that area can be an edge area, a functional area, a central area or some other area.

Referring to FIG. 4C, defect detection and localization system 110 can comprise control circuitry 118 coupled to the plurality of registers 120. Control circuitry 118 can be configured to manage or control operation of registers 120 and system 110 generally, such as by providing an input signal to Data_IN, receiving an output signal from Data_OUT and carrying out other operations discussed herein throughout. As depicted in the embodiment of FIG. 4C, control circuitry 118 can be external to chip 102 and coupled at least to registers 120. In other embodiments discussed herein, control circuitry 118 can be in or integral with chip 102 and/or registers 120. Control circuitry 118 will be discussed in more detail herein in the context of the operation of system 110.

Figure 5:
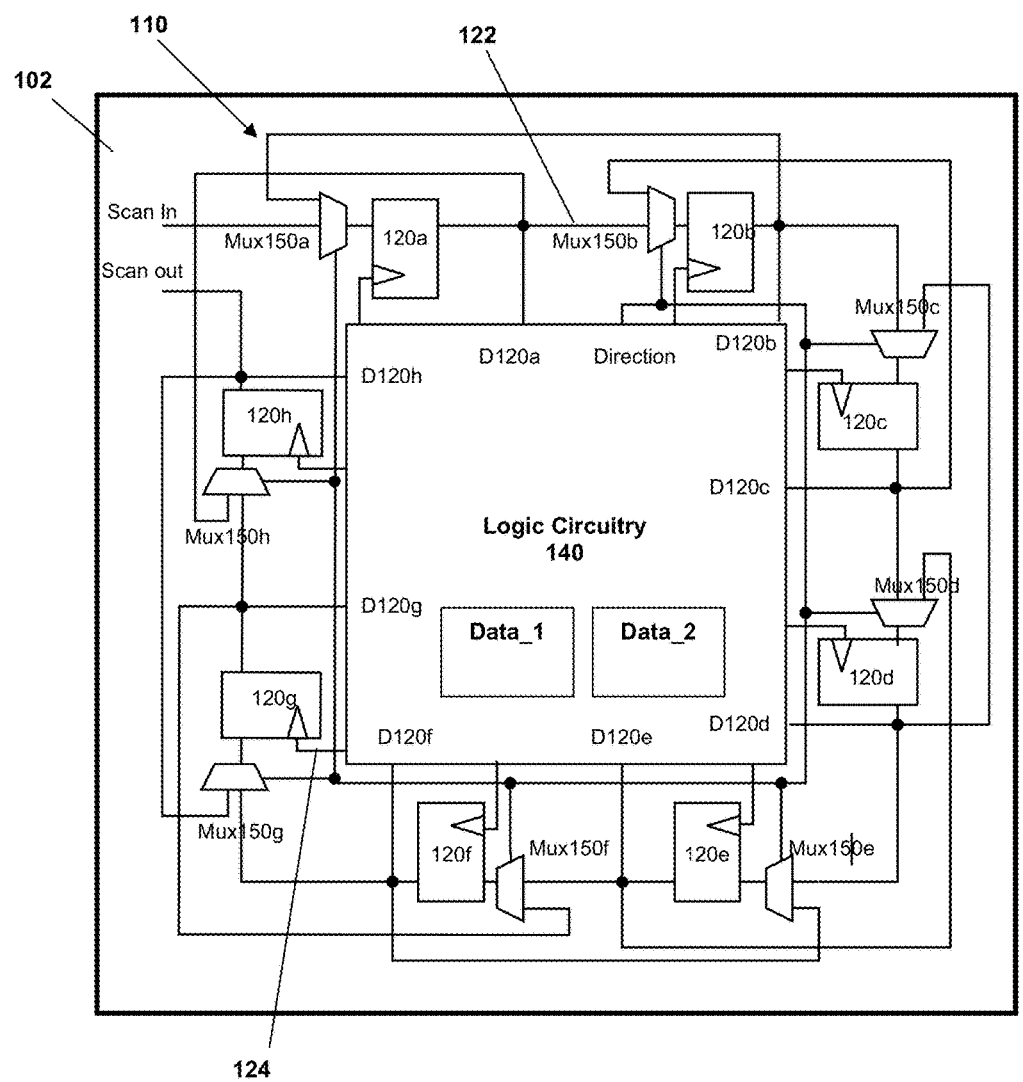
FIG. 5 is a block diagram of a semiconductor chip defect detection system according to an embodiment.

Referring to FIG. 5, in another embodiment chip 102 comprises logic circuitry 140 coupled to each of eight registers 120a, 120b, 120c, 120d, 120e, 120f, 120g and 120h. Logic circuitry 140 is depicted in chip 102 in FIG. 5 but can be external to chip 102 in other embodiments. As previously discussed, chip 102 can comprise some other number of registers 120n but in general will comprise at least eight such that a register is arranged on each corner and side. The discussion herein with respect to any particular number of registers, such as eight or twenty-four, is therefore not to be considered limiting. In an embodiment, system 110 also comprises a plurality of multiplexers (MUX) 150a, 150b, 150c, 150d, 150e, 150f, 150g and 150h coupled to each register 120a-120h, respectively. MUX 150a-150h enable defect detection system 110 to be used in either direction, i.e., clockwise from Scan_In to Scan-Out, or counter-clockwise from Scan-Out to Scan-In as controlled by a Direction signal from logic circuitry 140, providing additional testing and defect detection options. In embodiments, system 110 of FIG. 5 can be coupled to external control circuitry (see, e.g., control circuitry 118 of FIG. 4C), or control circuitry can be in chip 102, such as forming part of logic circuitry 140, in which case Scan-In and Scan_Out, though not so depicted in FIG. 5, are coupled to logic circuitry 140.

In general, logic circuitry 140 can coordinate execution of test routines in defect detection system 110 as well as other functions and can comprise a status register or other memory (not depicted in FIG. 5) for storing errors, reports or other information to be read out by an external device, such as external control circuitry in embodiments.

In operation, for example in end-of-line functional testing of chip 102 after packaging or at some other time, test routines can be executed using defect detection system 110. In embodiments, this testing is performed during a power-up phase of chip 102, running in parallel with other functional operations of chip 102, though this can vary in other embodiments or in particular applications or implementations of chip 102. For example, testing can be repeated during start-up or at other times during the life of chip 102 in order to detect new defects or expansion of original, smaller defects not previously detected and/or not affecting operation of some or all of chip 102.

As previously discussed, registers 120 of system 110 can comprise a shift register. In a simplified example and referring to FIG. 4 or FIG. 5, if register 120a comprises a logic "1," on the next clock signal on clock line 124 the "1" would be passed to register 120b via signal line 122, such that 120b now stores a logic "1" and register 120a then stores whatever was switched into its input in that clock signal. This can vary in other embodiments according to the particular type of register or flip-flop used, as understood by those skilled in the art. Moreover, different types of flip-flops, D-type or otherwise, or other types of registers can be used as registers 120 to form a shift register in other embodiments. The embodiment discussed herein is but one example embodiment not to be construed as limiting.

Returning to the aforementioned simplified example, defects in chip 102 can be detected depending upon whether a signal propagates from one register to the next, e.g., from register 120a to register 120b, all the way from the input of system 110 to the output of system 110. For example, if a logic "1" is applied to Data-IN or Scan_In of defect detection system 110 and does not propagate all the way through to Data-OUT or Scan_Out, respectively, a defect likely exists somewhere in die 102.

In addition to the detection of a defect, however, system 100 can detect a location of, or localize, a defect within chip 102. Returning to the example above, if a logic "1" is applied to register 120a but a defect has affected the operation of register 120b or has interrupted the portion of signal line 122 coupling registers 120a and 120b, the contents of each of the plurality of registers 120 can be read out, such as by logic circuitry 140 in FIG. 5, such that the defect can be localized as being at or between registers 120a and 120b. This can be particularly beneficial for identifying recurring defects. For example, if a high number of chips 102 show defects in a particular area, there could be a process or equipment problem as the cause thereof. While conventional defect detection approaches might identify that defects exist on a plurality of chips 102, they cannot pinpoint with specificity where those defects are located and therefore cannot identify recurring or common defects.

Figure 6:
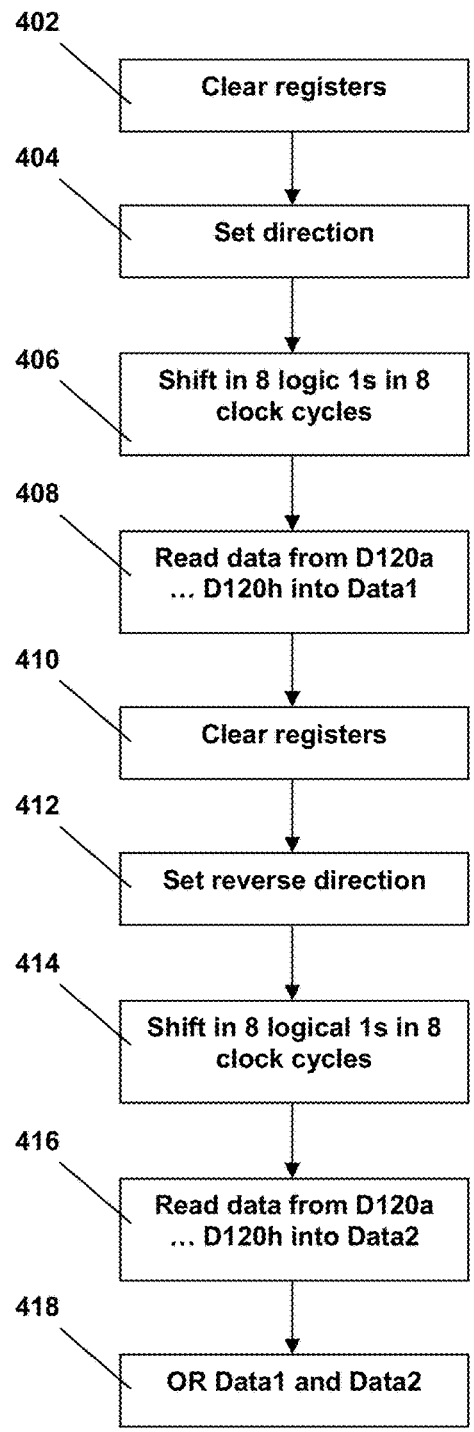
FIG. 6 is a flowchart of a semiconductor chip defect detection system test routine according to an embodiment.

For discussion purposes, example embodiments of system 110 with corresponding test routines will be discussed. Referring to FIGS. 5 and 6, one example of a test routine implemented by system 110 and logic circuitry 140 will be discussed. In this embodiment, logic circuitry 140 comprises control circuitry configured to manage operation of system 110 and the test routines executed thereby, and Scan_In and Scan_Out are coupled to logic circuitry 140. In other embodiments, as previously discussed, control circuitry (not depicted) external to chip 102 and coupled to Scan_In, Scan_Out and logic circuitry 140 can be used.

At 402, registers 120a-120h are cleared. In an embodiment, 402 can be carried out by logic circuitry 140. In embodiments, this clearing can be optional, and the contents, if any, of registers 120a-120h instead can be overwritten.

At 404, a direction, e.g., clockwise from Scan-In to Scan_Out or counter-clockwise from Scan_Out to Scan_In, is selected and set. The direction selection of 404 can be carried out in an embodiment by logic circuitry 140 and can alternate, be selected randomly, be chosen according to some other methodology or be optional in various embodiments.

At 406, a test signal, such as logic "1"s in one embodiment, are shifted into Scan_In or Scan_Out. In an embodiment, 406 is carried out by logic circuitry 140. In an embodiment comprising eight registers 120a-120h, eight "1"s are shifted in over eight clock cycles, such that each register 120a-120h stores a "1" if no defects are present. Some other test signal can be used in other embodiments, with the particular examples used herein throughout merely being examples for discussion purposes.

At 408, data from each register 120a-120h is read out and into a storage register. In an embodiment, the data from each register 120a-120h is read out by logic circuitry 140 and stored in a register Data_1 of logic circuitry 140. In an embodiment, the data of Data_1 can be checked to see whether each register 120a-120h contained a "1." In an embodiment, this checking can be carried out by logic circuitry 140. If so, no defects were present. If not, some defect is seemingly present, and logic circuitry 140 can provide an alarm signal or other notification thereof. The routine optionally can terminate at this point in embodiments until the next routine execution.

In another embodiment, the routine continues, checking for defects in the other direction. This can be beneficial, for example, because multiple defects could be present, and checking only one direction could reveal only one defect. For example, if a defect is present between registers 120b and 120c, this could be detected at 402-410 if the direction selected at 404 was clockwise. If a defect also exists between registers 120g and 120h, however, it would not be detected because the data input at Scan_In would likely have propagated only to register 120b. Moreover, reversing directions can provide access to a different test path if portions of defect detection line 110 pass through multiple or different layers of chip 102.

Therefore, in embodiments, registers 120a-120h optionally are cleared of any data at 410. In an embodiment, 410 can be carried out by logic circuitry 140.

The direction set at 404 is reversed at 412. In an embodiment, the direction can be set by logic circuitry 140.

Similar to 406, eight logic "1"s are shifted into Scan Out over eight clock cycles at 414. In an embodiment, 414 can be carried out by logic circuitry 140.

At 416, data is read from registers 120a-120h and stored in a second storage register. In an embodiment, the data is read by logic circuitry 140 and stored in register Data_2 of logic circuitry 140.

At 418, the contents of Data1 and Data2 are OR'ed in order to reveal the presence and locations of any defects detected in the two directions. In an embodiment, 418 is carried out by logic circuitry 140. Such a routine can be implemented, for example, as part of production testing or at some other time.

Figure 7:
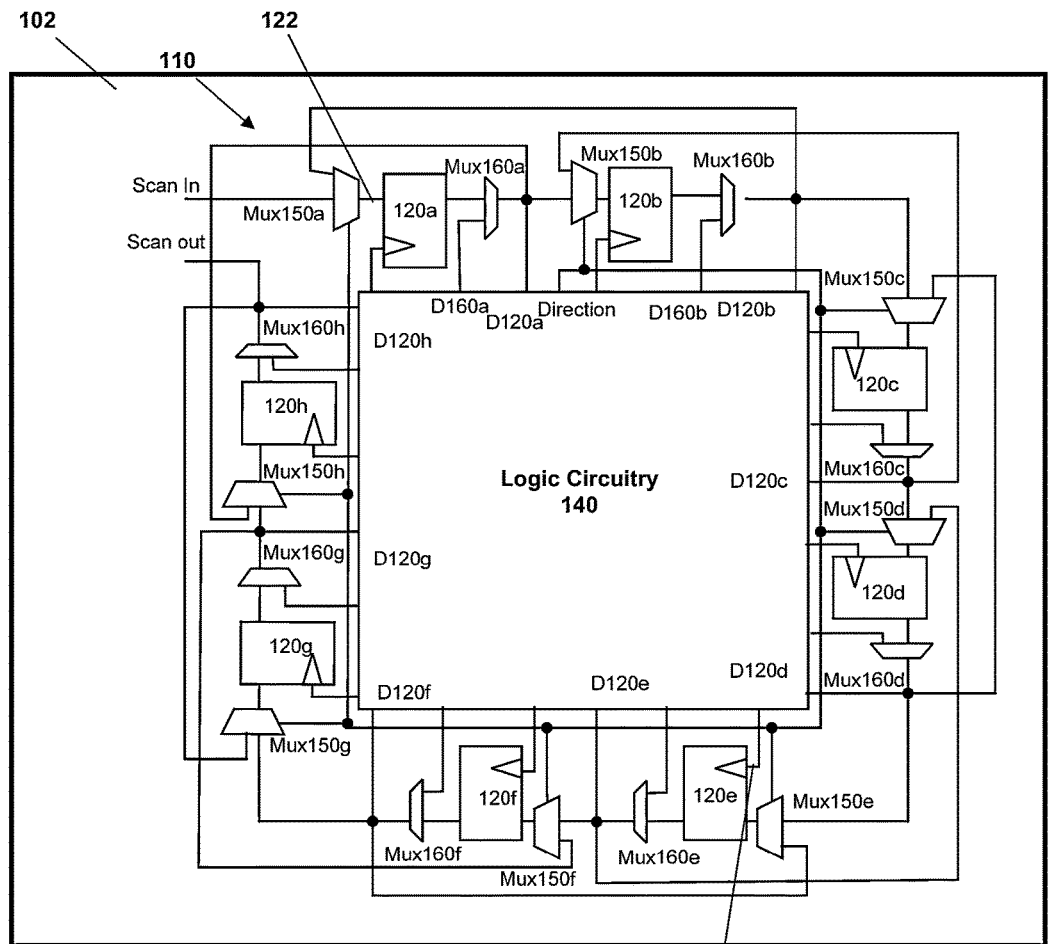
FIG. 7 is a block diagram of a semiconductor chip comprising a defect detection portion according to an embodiment.

Another example embodiment of system 110 is depicted in FIG. 7. Similar to the embodiment of FIG. 5, chip 102 comprises logic circuitry 140, eight registers 120a-120h and a MUX 150a-150h associated with each register 120a-120h, respectively, and coupling that register 120a-120h with a Direction pin of logic circuitry 140. The embodiment of FIG. 7 also comprises a second MUX 160a, 160b, 160c, 160d, 160e, 160f, 160g and 160h associated with each register 120a-120h, respectively, and coupled between the output pin of each register 120a-120h, a data pin for that register at logic circuitry 140 and an input to the other MUX 150a-150h of the next register 120a-120h. This arrangement enables data to be loaded in parallel to registers 120a-120h, with a single clock cycle shift in either direction, e.g., clockwise or counter-clockwise, performed before reading the data out from the registers 120a-120h by logic circuitry 140. This arrangement can be used in embodiments, for example, in field operation of chip 102, after production testing and during operational lifetime.

Figure 8:
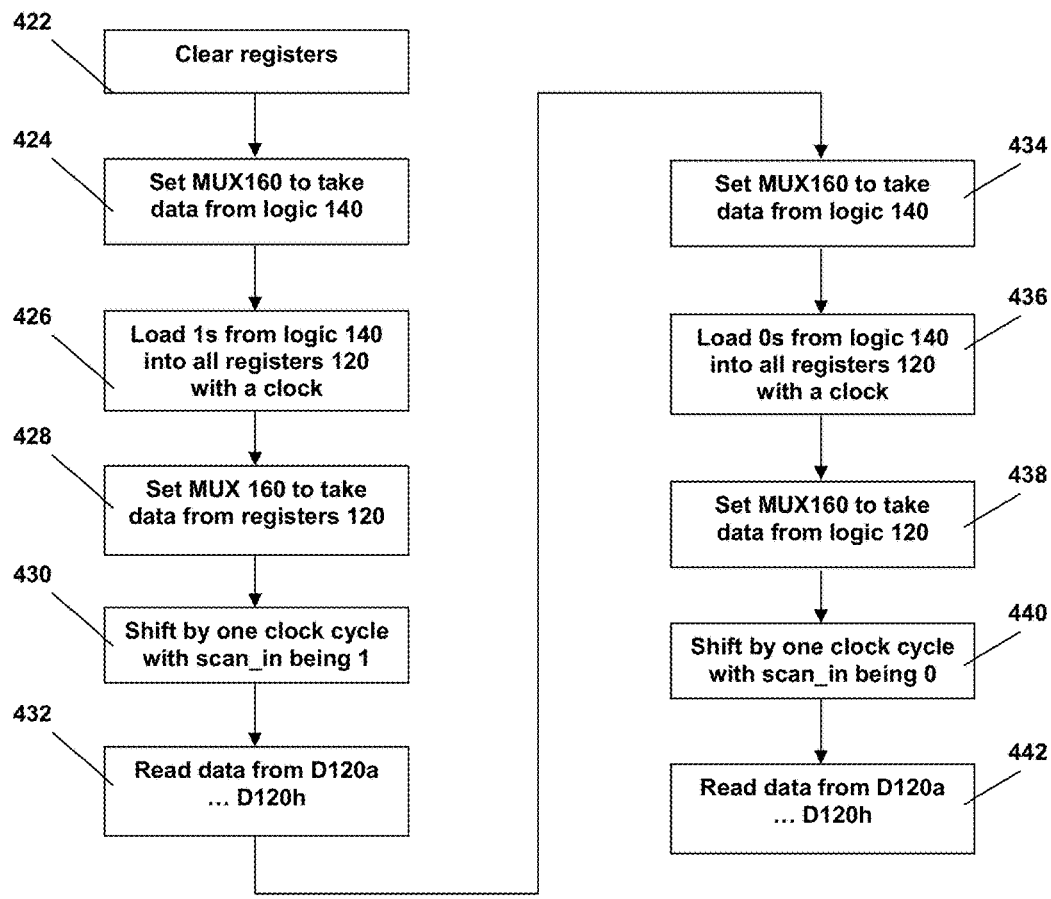
FIG. 8 is a flowchart of a semiconductor chip defect detection system test routine according to an embodiment.

Referring also to FIG. 8, an example test routine for use with chip 102 of FIG. 7 will be discussed. While example test routines are discussed herein with reference to one or more corresponding figures, these and other routines can be applied or modified for other figures or embodiments, and vice-versa. In the example embodiment discussed, logic circuitry 140 comprises control circuitry for implementing the test routine and controlling operation of system 110, though in other embodiments control circuitry can be external to chip 102 and coupled with system 110, Scan In, Scan Out and logic circuitry 140 (see, e.g., FIG. 4C).

At 422, registers 120a-120h optionally are cleared of any data. In an embodiment, 422 can be carried out by logic circuitry 140.

At 424, MUX 160a-160h are set to take data from logic circuitry 140. In an embodiment, 424 is carried out logic circuitry 140.

At 426, logic "1" values are loaded into each register 120a-120h on a clock signal. In an embodiment, 426 is carried out by loading the values from logic circuitry 140 into each register 120a-120h via MUX 160a-160h, respectively. A signal other than logic "1" values can be used in other embodiments.

At 428, MUX 160a-160h are set to take data from registers 120a-120h, respectively. In an embodiment, 428 is carried out by logic circuitry 140.

At 430, and in an embodiment in which the direction is clockwise, a logic "1" is shifted into defect detection line 110 at Scan-In on a clock signal. Thus, a "1" is shifted into register 120a, the data of register 120a is shifted to register 120b, the data of register 120b is shifted to register 120c, and so forth to register 120h. In an embodiment, 430 is carried out by logic circuitry 140.

At 432, the data is read from each register via MUX 160a-160h. In an embodiment, 432 is carried out by logic circuitry 140. Any register 120a-120h which provides a "0" instead of a "1" indicates that a defect likely exists between that register and the previous one from which it should have received data at 430, and/or that one or more registers 120a-120h are having difficulty transmitting a "1." The data received at 432 is optionally stored in logic circuitry 140 in a register or memory (not depicted) and/or the routine can optionally terminate at this point, in embodiments.

At 434, MUX 160a-160h are again set to take data from logic circuitry 140. In an embodiment, 434 is carried out by logic circuitry 140.

At 436, logic "0"s are loaded into each register 120a-120h. In an embodiment, 436 is carried out by logic circuitry 140 via MUX 160a-160h, respectively coupled to registers 120a-120h.

At 438, MUX 160a-160h are reset to take data from registers 120a-120h. In an embodiment, 438 is carried out by logic circuitry 140.

At 440, a logic "0" is shifted into system 110 at Scan-In on a clock signal. In an embodiment, the logic "0" is shifted in by logic circuitry 140. Thus, a "0" is shifted into register 120a, the data of register 120a is shifted to register 120b, the data of register 120b is shifted to register 120c, and so forth to register 120h. Again, the direction can be either clockwise or counter-clockwise in embodiments, and can be the same as or the opposite of the direction of 426-432. For example, in one embodiment the direction can be reversed between 438 and 440 by sending a Direction signal to MUX 150a-150h by logic circuitry 140.

At 442, logic circuitry 140 reads the data from each register via MUX 160a-160h. Any register 120a-120h which provides a "1" indicates that a defect likely exists between that register and the previous one from which it should have received data at 430, and/or that one or more registers 120a-120h are having difficulty transmitting "0." In another embodiment, either "1" or "0" can be used in both test cycles, rather than switching between the two as discussed above, or the direction can be reversed, or some other suitable test signal can be used. The data received at 442 is optionally stored in a register or memory (not depicted) of logic circuitry 140 and/or the routine can terminate at this point, in embodiments. In embodiments, multiple iterations of some or all of this routine can be repeated immediately, intermittently or on-demand.

Figure 9:
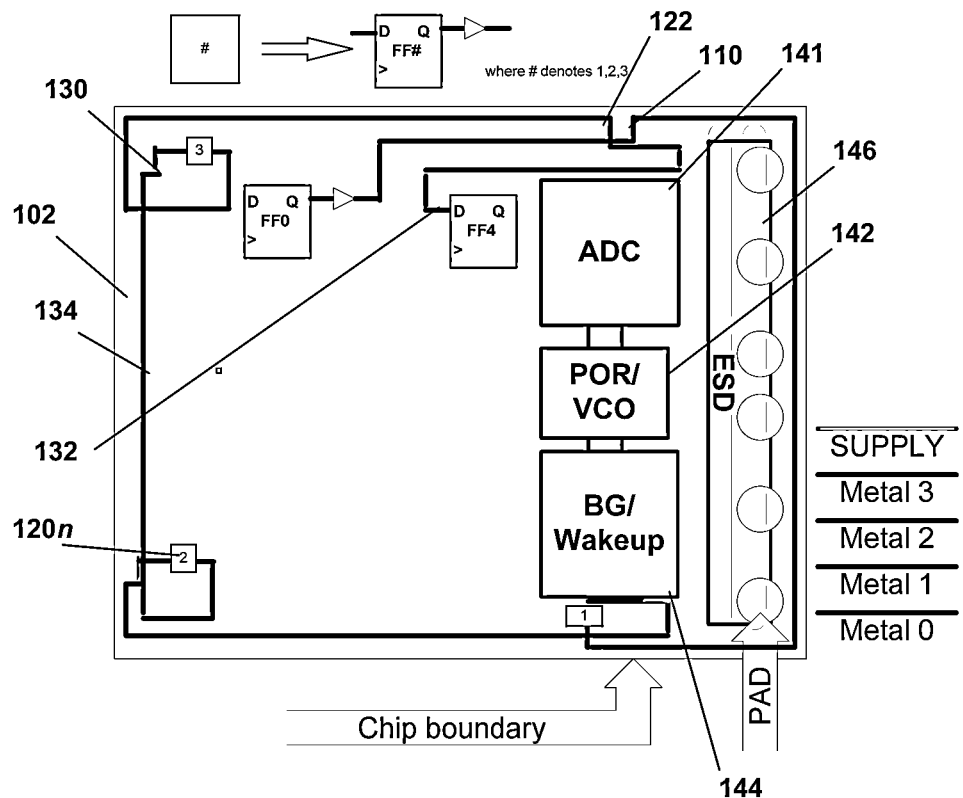
FIG. 9 is a block diagram of a semiconductor chip comprising a defect detection portion according to an embodiment.

In embodiments, system 110 can be implemented to detect defects in multiple layers of chip 102, as mentioned herein. Referring to FIG. 9, a least a portion of signal line 122 within system 110 can be routed through different layers of chip 102. In FIG. 9, some portions 130 of signal line 122 are routed through a Metal 1 layer and other portions through a Metal 0 (portion 132) and Metal 2 (portion 134) layers. This enables detection of defects in, in between, or otherwise affecting multiple layers of chip 102.

Moreover, it can provide opportunities to customize defect detection in particular layers in particular implementations of chip 102. For example, if one layer or material used in chip 102 is more prone to defects, or if that or another layer hosts sensitive or key components, defect detection and localization system 110 can be designed taking these factors into account such that coverage in layers or areas is customized. System 110 can also be used between layers, such as at the corners which can be vulnerable to some dicing defects, or in very simple single-layer implementations. In other words, system 110 can be used in virtually any chip 102, customized or simplified according to detecting defects in that particular design or implementation of chip 102.

The particular layers and materials illustrated in FIG. 9 are merely an example of one embodiment, and those skilled in the art will appreciate the applicability of various embodiments of system 110 and related methodologies to other technologies and compositions of chip 102. Also depicted in FIG. 9 is other circuitry implemented on chip 102, such as an analog-to-digital converter (ADC) 141, power-on reset (POR) and voltage-controlled oscillator (VCO) 142, bandgap (BG) and wakeup circuitry 144 and electrostatic discharge (ESD) circuitry 146, though this circuitry can vary in embodiments according to the particular function and operation of chip 102.

Figure 10:
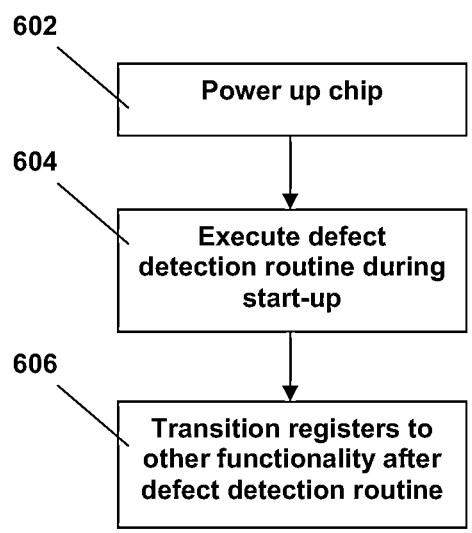
FIG. 10 is a flowchart of a semiconductor chip defect detection system test routine according to an embodiment.

In embodiments, some or all of system 110 can have multiple purposes within chip 102. For example, one or more of the plurality of registers 120 can be used for other functions in chip 102, and defect detection and localization routines can be implemented when these other functions are not in operation. For example, and referring to FIG. 10, in one embodiment a chip 102 is powered up at 602, and a defect detection and localization routine utilizing an embodiment of defect detection and localization system 110 is executed at 604. Defects can be reported, if detected, such as by occurrence and location, by logic or control circuitry as discussed herein. If no defects are detected, one or more of the plurality of registers 120 can be switched by switches or other circuitry, which again can be part of e.g., logic circuitry 140, external control circuitry 118 or some other circuitry (not depicted) in embodiments, or otherwise transitioned to other functionality within chip 102 at 606, such as for use as counters or for some other purpose. In other words, registers 120 of system 110 can operate in a defect detection mode and then be switched to some other mode within chip 102, and vice-versa. Registers 120 can remain in this alternate functionality until the next time a defect detection routine is executed in embodiments.

Figure 11A:
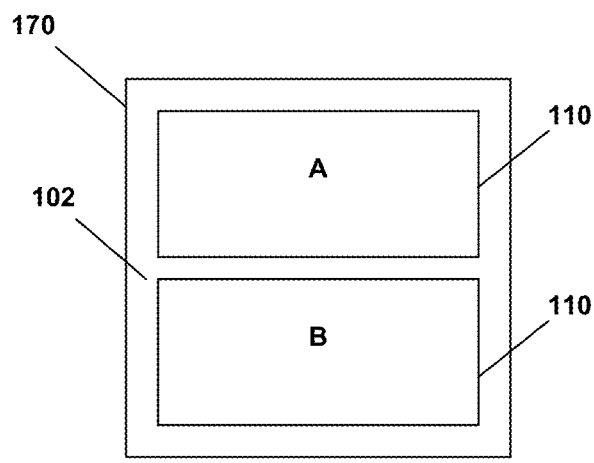
FIG. 11A is a block diagram of a semiconductor chip comprising a plurality of defect detection systems according to an embodiment.

Various applications of defect detection and localization system 110 and defect detection and localization routines related thereto are possible. For example, and referring to FIG. 11, which comprises FIGS. 11A and 11B, some safety-critical or other systems 170 comprise duplicated or redundant circuitry A and B as in FIG. 11A. If defect detection and localization system 110 is implemented in one or both instances A and B as in FIG. 11A, a defect detected in one instance of the circuitry, for example A, can result in system 170 transitioning to sole use of the other instance B to maintain functionality.

Figure 11B:
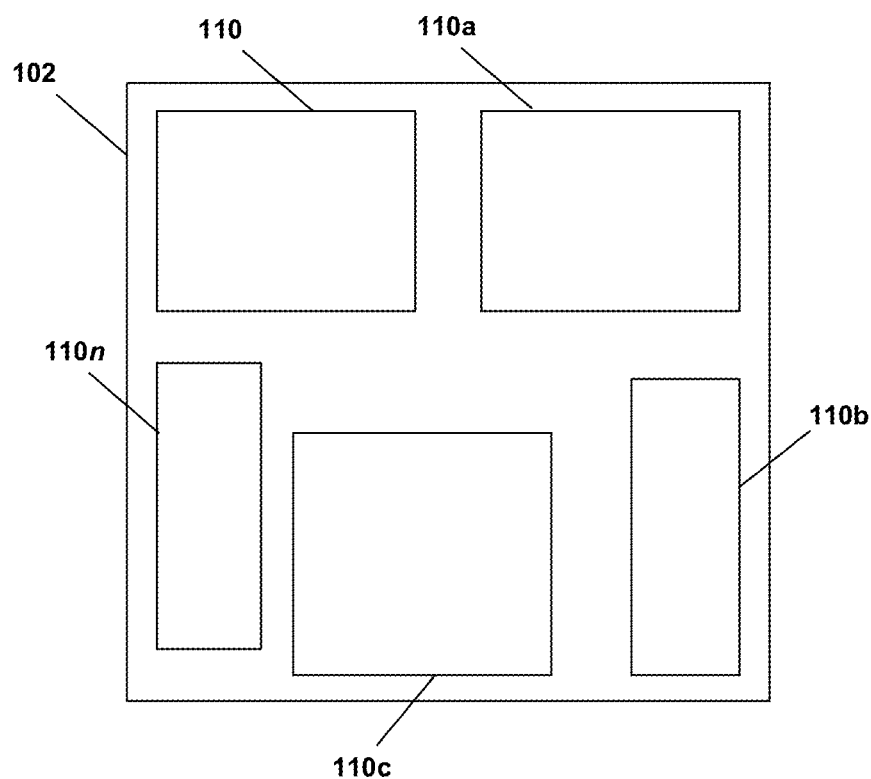
FIG. 11B is a block diagram of a semiconductor chip comprising a plurality of defect detection systems according to an embodiment.

Another embodiment can apply to a chip 102 which is relatively large and therefore has more area to check for defects. Referring to FIG. 11B, one example embodiment of such a chip 102 is depicted. Chip 102 comprises a plurality of different defect detection and localization systems 110: a main system 110 and 1 to n groups 110a, 110b, 110c and 110n. Each of the groups 110-110n can be sized or shaped differently and cover a larger or smaller area of chip 102.

Figure 12A:
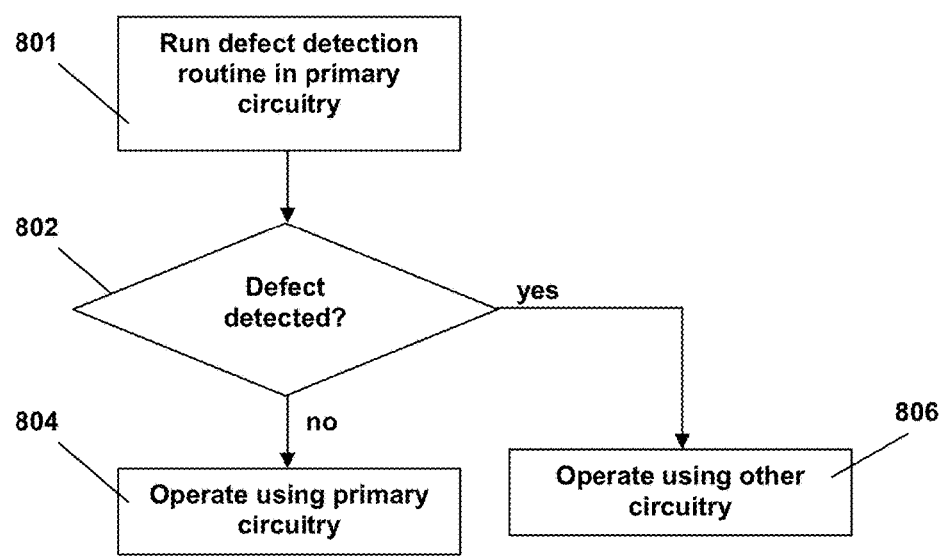
FIG. 12A is a flowchart of a semiconductor chip defect detection system test routine according to an embodiment.

In a similar vein, another application can be in a system which comprises primary functional circuitry as well as redundant functional circuitry, a lower performance version of the functional circuitry or a functional subset thereof. Such a system can be similar to that which is depicted in FIG. 3B, wherein the primary circuitry is surrounded by system 110 and the lower performance circuitry is located in the other portion of chip 102. Referring also to FIG. 12A, a defect detection and localization routine can be executed at 801. Query at 802 if a defect was detected by system 110. At 806, if a defect is detected affecting operation of the primary, the chip 102 can be transitioned to use of the redundant, lower performance or other circuitry until the primary circuitry defect can be addressed. This transition can be carried out in embodiments by logic circuitry 140, control circuitry 118 or some other suitable circuitry in or external to chip 102. If no defect is detected in the primary circuitry, normal operation of the primary circuitry can continue at 804. Such a system could be advantageous in some automotive applications, in which it could be dangerous if the primary circuitry fails, e.g., while a car is traveling at a high rate of speed or in some critical system affecting basic operation or safety.

Figure 12B:
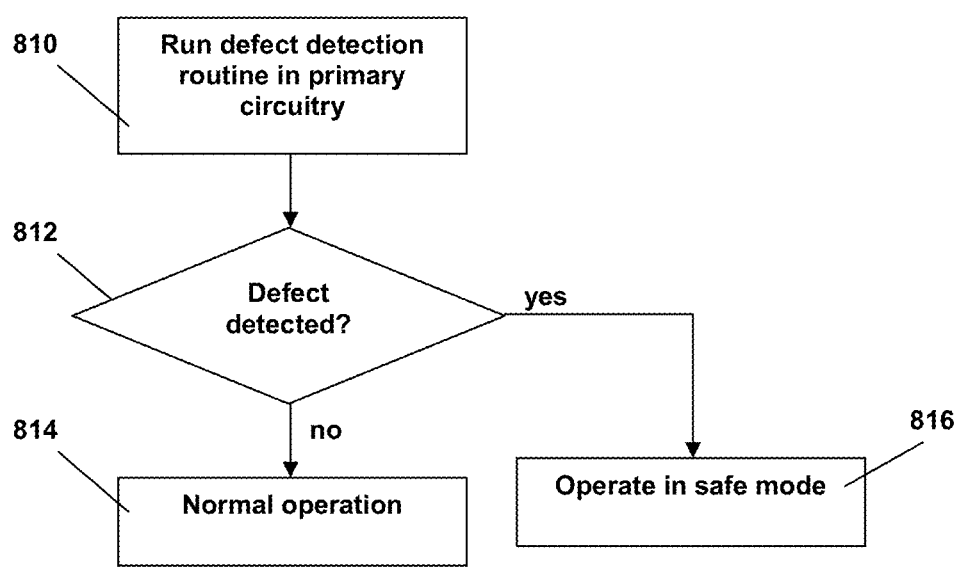
FIG. 12B is a flowchart of a semiconductor chip defect detection system test routine according to an embodiment.

Referring to FIG. 12B, and continuing with the non-limiting automotive example mentioned above, redundant, lower performance or "safety" operation mode would enable a driver to be warned of an operational error or failure and the car to remain sufficiently operational such that it could be guided to the side of the road and safely stopped. For example, at 810 a test routine is executed by system 110 and related circuitry (e.g., logic circuitry 140 and/or control circuitry 118 or some other circuitry). Query at 812 whether a defect was detected. If the routine is successful, normal operation using the tested chip or circuitry portion continues at 814. If the routine is not successful and a defect is detected, a safe mode as mentioned above can be entered at 816. This, the previous and other examples can have applicability in other safety-critical applications, including aerospace, medical, power technologies and other applications. Embodiments also can be implemented in less complex environments, including in drivers, amplifiers and other semiconductor-based circuitry.

Figure 12C:
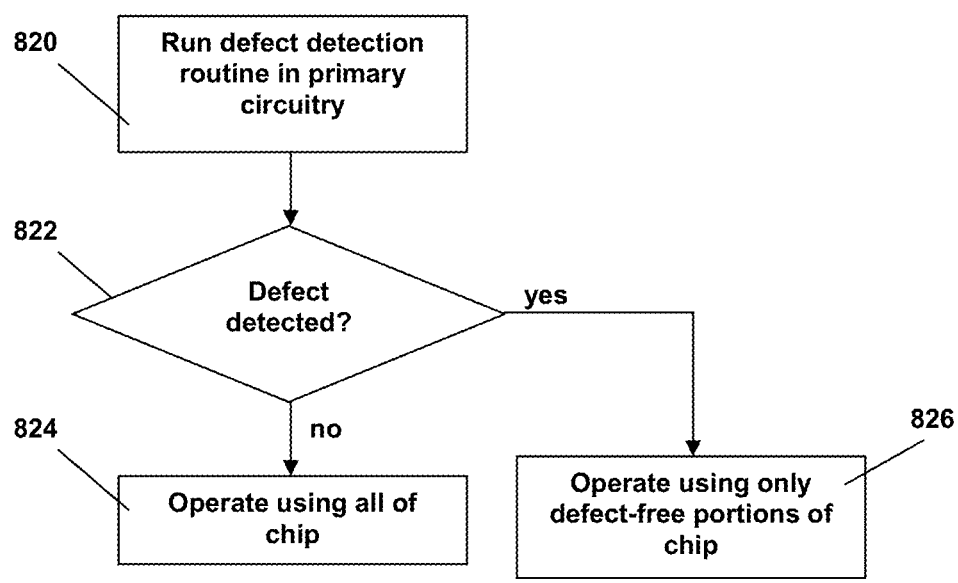
FIG. 12C is a flowchart of a semiconductor chip defect detection system test routine according to an embodiment.

Referring to FIG. 12C, in another embodiment, system 110 can allow functionality in only groups or subgroups of chip 102 which pass a test. For example, and referring also to FIG. 11B, if systems 110b and 110c detect defects and systems 110 and 110a do not detect defects at 820 and 822, system 110 and/or circuitries 140 and/or 118 could allow only the portions of chip 102 associated with circuitries 110 and 110a to operate at 826.

Figure 12D:
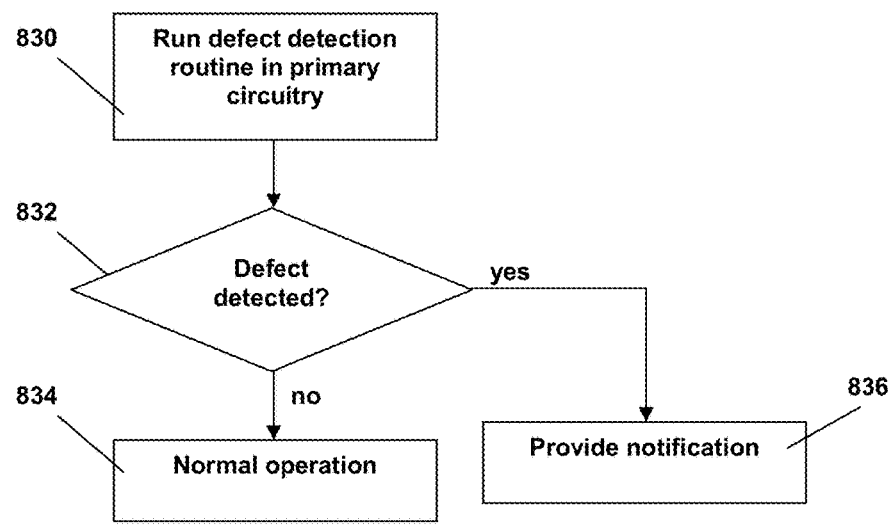
FIG. 12D is a flowchart of a semiconductor chip defect detection system test routine according to an embodiment.

In yet another embodiment, and referring to FIG. 12D, logic circuitry 140 and/or external circuitry 118 can provide an alarm, alert or other notification at 836 if a defect is detected at 832 after running a defect detection routine using system 110 at 830. In addition to the defect detection, functionality of chip 102 or circuitry thereof can be suspended or can continue in accordance with one of the other embodiments, such as those of FIGS. 12A-12C or some combination of thereof. Of course, alerts, alarms or other notifications also can be provided as part of the embodiments of FIGS. 12A-12C as well as other defect detection routines and embodiments discussed herein.

Embodiments thereby provide defect detection and localization systems and methods that provide numerous advantages. Embodiments enable faster defect detection as well as defect localization that provide time and resource savings while also enabling failure analysis.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A semiconductor chip defect detection and localization system comprising:

a plurality of registers spaced apart from one another and coupled with one another by a signal line, wherein the signal line is arranged in a plurality of layers of a semiconductor chip; and logic circuitry coupled to the plurality of registers and configured to determine a presence, a location, and a layer of a physical defect in at least one of the plurality of layers in which the signal line is arranged based on whether a signal propagates along the signal line and through one or more of the plurality of registers, wherein the logic circuitry is configured to determine the location and the layer of the physical defect in at least one of the plurality of layers based on a failure of a signal to propagate from a first one of the plurality of registers along the signal line to a second adjacent one of the plurality of registers, wherein the location of the physical defect is proximate the first one or the second adjacent one of the plurality of registers.

2. The system of claim 1, wherein the system is arranged in the semiconductor chip.

3. The system of claim 2, wherein at least a portion of the signal line is arranged proximate an edge of the semiconductor chip.

4. The system of claim 1, wherein the plurality of registers and the signal line are arranged in the semiconductor chip.

5. The system of claim 4, wherein the logic circuitry is arranged external to the semiconductor chip.

6. The system of claim 1, further comprising at least one buffer coupled to the signal line between adjacent ones of the plurality of registers.

7. The system of claim 1, wherein the logic circuitry is configured to provide an output signal indicating the presence of a physical defect.

8. The system of claim 7, wherein the output signal comprises the location of the physical defect.

9. The system of 1, wherein the plurality of registers comprises at least eight registers.

10. The system of claim 9, wherein the plurality of registers comprises at least twenty-four registers.

11. The system of claim 1, wherein the plurality of registers comprise flip-flops.

12. The system of claim 1, wherein the logic circuitry is configured to determine the presence, the location, and the layer of the physical defect during a start-up phase of the semiconductor chip.

13. The system of claim 1, wherein the logic circuitry is configured to select a direction of propagation of the signal through the plurality of registers.

14. A method comprising:

causing a signal to propagate through a plurality of registers that are coupled to one another by at least one signal line and spaced apart from another in a semiconductor chip, wherein the at least one signal line is arranged in a plurality of layers of the semiconductor chip;

determining a presence and a layer of a physical defect in at least one of the plurality of layers in which the at least one signal line is arranged according to whether the signal propagates along the at least one signal line through the plurality of registers; and determining the location and the layer of the physical defect in at least one of the plurality of layers based on a failure of a signal to propagate from a first one of the plurality of registers along the signal line to a second adjacent one of the plurality of registers, wherein the location of the physical defect is proximate the first one or the second adjacent one of the plurality of registers.

15. The method of claim 14, further comprising providing the semiconductor chip.

16. The method of claim 14, further comprising arranging at least a portion of the at least one signal line along an edge of the semiconductor chip.

17. The method of claim 14, further comprising arranging at least a portion of the at least one signal line proximate a functional area of the semiconductor chip.

18. The method of claim 14, further comprising causing the semiconductor chip to operate in a safe mode if a result of the determining is the presence of a physical defect.

19. The method of claim 14, further comprising causing the semiconductor chip to use circuitry arranged in a portion of the semiconductor chip away from the location of the defect if a result of the determining is the presence of a physical defect.

20. The method of claim 14, further comprising using at least one of the plurality of registers for a function other than defect detection and localization.

21. The method of claim 14, further comprising providing an output signal if a physical defect is detected.

22. A device comprising:
means for causing a signal to propagate along at least one signal line and through a plurality of registers spaced apart from one another in a semiconductor chip, the plurality of registers being coupled to one another by the at least one signal line, and the at least one signal line being arranged in a plurality of layers of the semiconductor chip;
means for determining a presence, a location, and a layer of a physical defect in at least one of the plurality of layers of the semiconductor chip based on whether the signal propagates through the plurality of registers, wherein the means for determining a presence, a location, and a layer of the physical defect is configured to determine the location and the layer of the physical defect in at least one of the plurality of layers based on a failure of a signal to propagate from a first one of the plurality of registers along the signal line to a second adjacent one of the plurality of registers, wherein the location of the physical defect is proximate the first one or the second adjacent one of the plurality of registers.

* * * * *